US011472957B2

(12) United States Patent
Iwaya et al.

(10) Patent No.: US 11,472,957 B2
(45) Date of Patent: Oct. 18, 2022

(54) RESIN COMPOSITION, ADHESIVE, SEALING MATERIAL, DAM AGENT, SEMICONDUCTOR DEVICE AND IMAGE SENSOR MODULE

(71) Applicant: NAMICS CORPORATION, Niigata (JP)

(72) Inventors: Kazuki Iwaya, Niigata (JP); Fuminori Arai, Niigata (JP)

(73) Assignee: NAMICS CORPORATION, Niigata (JP)

( * ) Notice: Subject to any disclaimer, the term of this patent is extended or adjusted under 35 U.S.C. 154(b) by 447 days.

(21) Appl. No.: 16/338,727

(22) PCT Filed: Oct. 23, 2017

(86) PCT No.: PCT/JP2017/038137
§ 371 (c)(1),
(2) Date: Apr. 2, 2019

(87) PCT Pub. No.: WO2018/079466
PCT Pub. Date: May 3, 2018

(65) Prior Publication Data
US 2020/0123375 A1    Apr. 23, 2020

(30) Foreign Application Priority Data

Oct. 26, 2016   (JP) .............................. JP2016-209413

(51) Int. Cl.
| | |
|---|---|
| *B32B 27/38* | (2006.01) |
| *B32B 27/26* | (2006.01) |
| *C08G 59/68* | (2006.01) |
| *C08G 59/66* | (2006.01) |
| *C08G 59/24* | (2006.01) |
| *C09J 163/02* | (2006.01) |
| *C08L 63/02* | (2006.01) |
| *H01L 23/29* | (2006.01) |
| *C08L 63/00* | (2006.01) |
| *C08K 5/00* | (2006.01) |
| *C08K 5/3445* | (2006.01) |
| *C08K 5/5419* | (2006.01) |
| *C09J 163/00* | (2006.01) |

(52) U.S. Cl.
CPC .............. *C08L 63/00* (2013.01); *B32B 27/26* (2013.01); *B32B 27/38* (2013.01); *C08G 59/66* (2013.01); *C08G 59/68* (2013.01); *C08K 5/0025* (2013.01); *C08K 5/3445* (2013.01); *C08K 5/5419* (2013.01); *C09J 163/00* (2013.01); *C08L 2203/206* (2013.01); *C08L 2312/00* (2013.01); *H01L 23/29* (2013.01)

(58) Field of Classification Search
None
See application file for complete search history.

(56) References Cited

U.S. PATENT DOCUMENTS

| | | | |
|---|---|---|---|
| 5,430,112 A | 7/1995 | Sakata | |
| 2014/0131618 A1 | 5/2014 | Matson | |
| 2016/0289237 A1* | 10/2016 | Kumano | .............. C08G 59/245 |
| 2017/0073459 A1* | 3/2017 | Iwaya | .................... C08G 59/66 |
| 2017/0174823 A1 | 6/2017 | Weippert | |
| 2018/0051127 A1 | 2/2018 | Arai | |
| 2018/0051128 A1 | 2/2018 | Iwaya et al. | |

FOREIGN PATENT DOCUMENTS

| | | | |
|---|---|---|---|
| JP | H02038418 A | 2/1990 | |
| JP | H06211969 A | 8/1994 | |
| JP | H06211970 A | 8/1994 | |
| JP | 10298526 A * | 11/1998 | ............ C09J 163/00 |
| JP | 2005118723 A | 5/2005 | |
| JP | 2008260850 A | 10/2008 | |
| JP | 2012122012 A | 6/2012 | |
| JP | 2016-169275 A | 9/2016 | |
| JP | WO2014/084292 A1 | 1/2017 | |
| WO | 2014/078282 A1 | 5/2014 | |
| WO | WO-2015080241 A1 * | 6/2015 | ........... C07D 487/04 |
| WO | 2015121341 A1 | 8/2015 | |
| WO | WO-2015141347 A1 * | 9/2015 | ............... C08K 5/55 |
| WO | 2016/143815 A1 | 9/2016 | |

OTHER PUBLICATIONS

Machine translation of JP-10298526-A (no date).*
Partial translation of JP 10-298526 A, provided by the USPTO Translations Service Center (no date).*
Submission of Publication by third party filed in JP Application No. 2018-547645 dated Sep. 10, 2019.
Notice of Submission of Publications, etc. issued by Japan Patent Office in JP Application No. 2018-547645 dated Sep. 17, 2019.
Written request for inspection (public inspection) of items recorded in file of JP Application No. 2018-547645 dated Sep. 18, 2019.
Office Action dated Mar. 12, 2021 for the corresponding Chinese Patent Application No. 201780058142.5.
Submission of Publication by third party dated Oct. 7, 2020 for the corresponding Japanese Patent Application No. 2018-547645.
Notice of Submission of Publications, etc. dated Oct. 27, 2020 for the corresponding Japanese Patent Application No. 2018-547645.
International Search Report dated Jan. 23, 2018 filed in PCT/JP2017/038137.

\* cited by examiner

*Primary Examiner* — Michael J Feely
(74) *Attorney, Agent, or Firm* — Rankin, Hill & Clark LLP

(57) ABSTRACT

Provided is a resin composition, which is fast curable at low temperature, has high adhesive strength (especially, high peel strength) after curing, and can suppress a decrease in adhesive strength (especially, in peel strength) after a moisture resistance test of the resin composition after curing, and further has excellent pot life. Provided is the resin composition including: (A) an epoxy resin; (B) a thiol compound represented by $C(CH_2OR^1)(CH_2OR^2)(CH_2OR^3)(CH_2OR^4)$ (wherein $R^1$, $R^2$, $R^3$ and $R^4$ are each independently hydrogen or $C_nH_{2n}SH$ (wherein n is 2 to 6), at least one of $R^1$, $R^2$, $R^3$ and $R^4$ is $C_nH_{2n}SH$ (wherein n is 2 to 6)); (b) a polyfunctional thiol compound other than the (B); and (C) a latent curing accelerator.

18 Claims, 1 Drawing Sheet

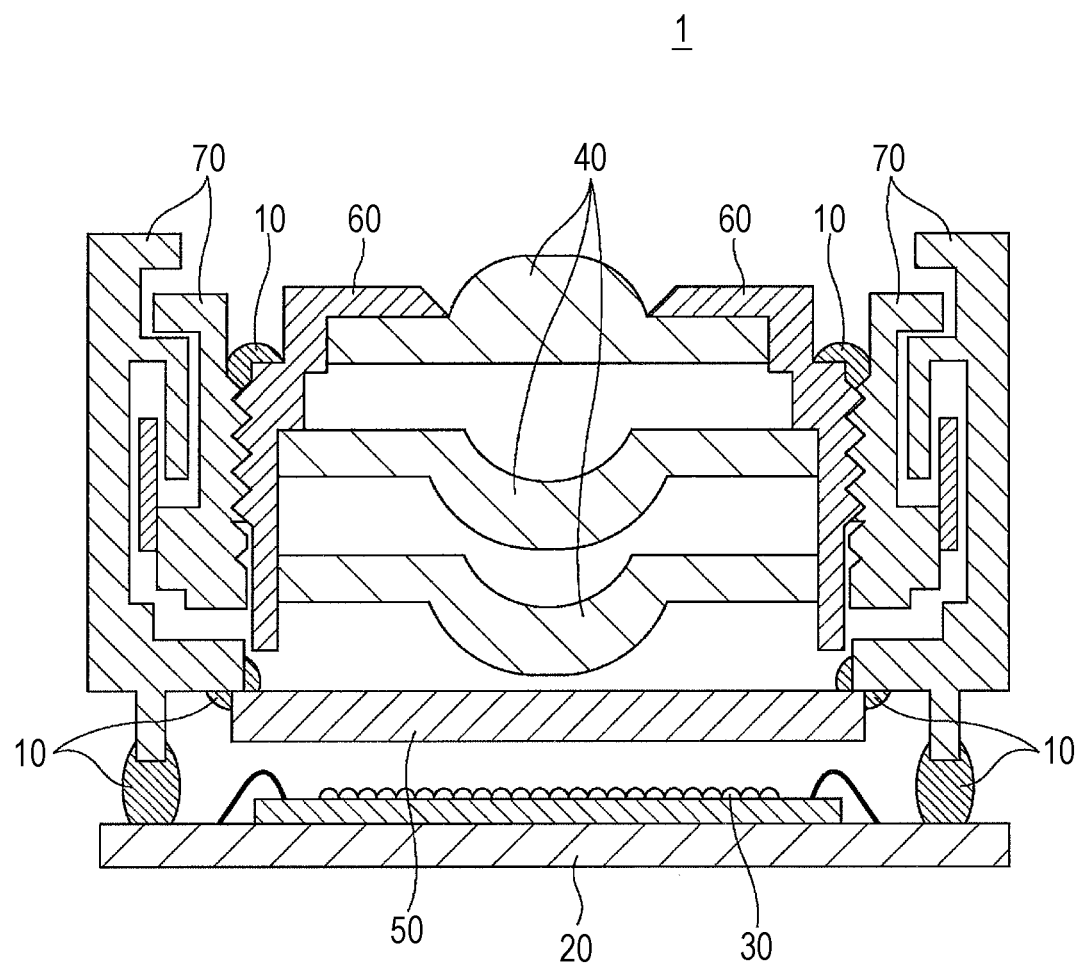

RESIN COMPOSITION, ADHESIVE, SEALING MATERIAL, DAM AGENT, SEMICONDUCTOR DEVICE AND IMAGE SENSOR MODULE

TECHNICAL FIELD

The present disclosure relates to a low temperature fast curable resin composition and the like.

BACKGROUND ART

Resin compositions which are fast curable at low temperature and have excellent moisture resistance after curing are known. At present, electronic components such as semiconductor chips in a semiconductor device are used after being bonded, sealed or the like with a resin composition in order to maintain reliability and the like. Among the semiconductor devices, especially when manufacturing process of an image sensor module is high temperature, a lens or the like used in the image sensor module deteriorates. Therefore, as an image sensor module application, low temperature curability is required for an adhesive and a sealing material used for manufacturing the image sensor module. From the viewpoint of production cost, short-time curability is also required at the same time. In addition, it is also required that usable time of the resin composition is long, that is, pot life is long.

Further, members of recent image sensor modules include various materials such as glass, metal, or liquid crystal polymer (hereinafter referred to as LCP). Thus, there is a need for the adhesive having high adhesive strength and moisture resistance reliability to an adherend containing members formed of these various materials, regardless of the material of the adherend.

Here, it is known that an epoxy resin-thiol curing agent-based resin composition is effective in achieving low temperature fast curability highly demanded in recent years (PATENT LITERATURES 1 and 2). However, a conventional thiol-based curing agent (for example, pentaerythritol tetrakis (3-mercaptopropionate) (trade name: PEMP) manufactured by SC Organic Chemical Co., Ltd., trimethylolpropane tris(3-mercaptopropionate) (trade name: TMMP) manufactured by SC Organic Chemical Co., Ltd., and pentaerythritol tetrakis (3-mercaptobutyrate) (trade name: KarenzMT PE1) manufactured by Showa Denko K. K.) has a problem that the resin composition after curing is inferior in moisture resistance. This is presumably because all of the conventional thiol-based curing agents contain an ester structure in their molecular skeleton.

CITATION LIST

Patent Literature

PATENT LITERATURE 1: JP-A-06-211969
PATENT LITERATURE 2: JP-A-06-211970

SUMMARY OF THE INVENTION

Problems to be Solved by the Invention

The resin composition and the like of the present disclosure have been completed in view of the above problems. That is, an object of the present disclosure is to provide i) a resin composition, ii) an adhesive, a sealing material and a dam agent using the resin composition, iii) a semiconductor device using the adhesive, the sealing material or the dam agent, and iv) an image sensor module using the semiconductor device, which are fast curable at low temperature, have high adhesive strength (especially, peel strength) after curing, can suppress a decrease in adhesive strength (especially, peel strength) after a moisture resistance test after curing, and have excellent pot life.

Solution to the Problems

The present inventors have conducted intensive studies to solve the above-mentioned problems. As a result, it was possible to obtain the resin composition which is fast curable at low temperature, has high adhesive strength (especially, peel strength), can suppress a decrease in adhesive strength after a moisture resistance test, and has excellent pot life, by using the epoxy resin in combination with a specific thiol compound and using a latent curing accelerator.

The present disclosure relates to the resin composition, the adhesive, the sealing material, the dam agent, and the semiconductor device which solve the above problems by the following composition.

[1] (A) an epoxy resin;
(B) a thiol compound represented by the following general formula (1)

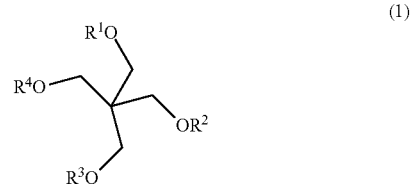

A resin composition including (wherein $R^1$, $R^2$, $R^3$ and $R^4$ are each independently hydrogen or $C_nH_{2n}SH$ (wherein n is 2 to 6), at least one of $R^1$, $R^2$, $R^3$ and $R^4$ is $C_nH_{2n}SH$ (wherein n is 2 to 6));
(b) a polyfunctional thiol compound other than the component (B); and
(C) a latent curing accelerator.
[2] The resin composition according to the above-mentioned [1], wherein component (b) is a thiol compound having no ester bond.
[3] The resin composition according to the above-mentioned [1] or [2], wherein component (b) is a thiol-substituted glycoluril derivative.
[4] The resin composition according to any one of the above-mentioned [1] to [3], wherein an amount of component (B) is 5 to 80 parts by mass based on 100 parts by mass of total amount of the thiol compounds as component (B) and component (b).
[5] The resin composition according to any one of the above-mentioned [1] to [4], which is curable at 80° C. in 1 hour.
[6] An adhesive including the resin composition according to any one of the above-mentioned [1] to [5].
[7] A sealing material including the resin composition according to any one of the above-mentioned [1] to [5].
[8] A dam agent including the resin composition according to any one of the above-mentioned [1] to [5].
[9] A semiconductor device including a cured product of the resin composition according to any one of the above-mentioned [1] to [5], a cured product of the adhesive according to the above-mentioned [6], a cured product of the sealing material according to the above-mentioned [7], or a cured product of the dam agent according to the above-mentioned [8].

[10] The semiconductor device according to the above-mentioned [9], wherein at least two adherends formed of at least one material selected from the group consisting of engineering plastics, ceramics, and metals are bonded with the cured product of the adhesive according to the above-mentioned [6].

[11] The semiconductor device according to the above-mentioned [10], wherein the engineering plastic is a super engineering plastic.

[12] The semiconductor device according to the above-mentioned [10] or [11], wherein the engineering plastic is at least one selected from the group consisting of liquid crystal polymers, polycarbonates, polyimides, polyamides, polyamideimides, polyetherimides, and epoxy resins.

[13] An image sensor module including the semiconductor device according to any one of the above-mentioned [9] to [12].

Effects of the Invention

According to the present disclosure [1], it is possible to provide the resin composition which is fast curable at low temperature, has high adhesive strength (especially, peel strength) after curing, can suppress a decrease in adhesive strength (especially, peel strength) after the moisture resistance test after curing, and has excellent pot life.

According to the present disclosure [6], it is possible to obtain the adhesive which is fast curable at low temperature, has high adhesive strength (especially, peel strength) after curing, and can suppress a decrease in adhesive strength (especially, peel strength) after the moisture resistance test after curing. According to the present disclosure [7], it is possible to obtain the sealing material which is fast curable at low temperature, has high adhesive strength (especially, peel strength) after curing, and can suppress a decrease in adhesive strength (especially, peel strength) after the moisture resistance test after curing. According to the present disclosure [8], it is possible to obtain the dam agent which is fast curable at low temperature, has high adhesive strength (especially, peel strength) after curing, and can suppress a decrease in adhesive strength (especially, peel strength) after the moisture resistance test after curing. According to the present disclosure [9], it is possible to obtain the semiconductor device with high reliability, for example, the image sensor module including the cured product of the resin composition, the adhesive, the sealing material, or the dam agent, which is fast curable at low temperature, has high adhesive strength (especially, peel strength) after curing, and can suppress a decrease in adhesive strength (especially, peel strength) after the moisture resistance test after curing.

BRIEF DESCRIPTION OF THE DRAWINGS

FIG. 1 is an example of a cross-sectional view of an image sensor module.

DESCRIPTION OF THE EMBODIMENTS

[Resin Composition]

A resin composition of the present embodiment (hereinafter referred to as the resin composition) includes:
(A) an epoxy resin;
(B) a thiol compound represented by the following general formula (1)

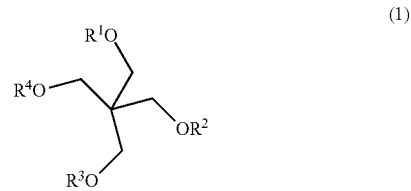

(wherein $R^1$, $R^2$, $R^3$ and $R^4$ are each independently hydrogen or $C_nH_{2n}SH$ (wherein n is 2 to 6), at least one of $R^1$, $R^2$, $R^3$ and $R^4$ is $C_nH_{2n}SH$ (wherein n is 2 to 6));
(b) a polyfunctional thiol compound other than the component (B); and
(C) a latent curing accelerator.

Examples of the epoxy resin as the component (A) include liquid bisphenol A type epoxy resin, liquid bisphenol F type epoxy resin, liquid naphthalene type epoxy resin, liquid hydrogenated bisphenol type epoxy resin, liquid alicyclic epoxy resin, liquid alcohol ether type epoxy resin, liquid cycloaliphatic type epoxy resin, liquid fluorene type epoxy resin, and liquid siloxane-based epoxy resin. Among them, liquid bisphenol A type epoxy resin, liquid bisphenol F type epoxy resin, liquid siloxane-based epoxy resin, and aminophenol type epoxy resin are preferable from the viewpoints of curability, heat resistance, adhesiveness, and durability. Epoxy equivalent is preferably 80 to 1000 g/eq, more preferably 80 to 500 g/eq from the viewpoints of curability and elastic modulus of the cured product. Examples of commercially available products include bisphenol F type epoxy resin (product name: YDF 8170) manufactured by Nippon Steel & Sumikin Chemical Co., Ltd., bisphenol A type epoxy resin (product name: EXA-850CRP) manufactured by DIC Corporation, bisphenol A type bisphenol F type mixed epoxy resin (product name: EXA-835LV) manufactured by DIC Corporation, naphthalene type epoxy resin (product name: HP4032D) manufactured by DIC Corporation, siloxane type epoxy resin (product name: TSL9906) manufactured by Shin-Etsu Chemical Co., Ltd., aminophenol type epoxy resin (grade: JER630, JER630LSD) manufactured by Mitsubishi Chemical Corporation, and epoxy resin (grade: AER9000) manufactured by Asahi Kasei Corporation. As the component (A), a single resin may be used, or two or more resins may be used in combination.

The thiol compound as component (B) is represented by the following general formula (1):

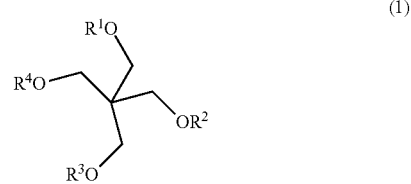

(wherein $R^1$, $R^2$, $R^3$ and $R^4$ are each independently hydrogen or $C_nH_{2n}SH$ (wherein n is 2 to 6), at least one of $R^1$, $R^2$, $R^3$ and $R^4$ is $C_nH_{2n}SH$ (wherein n is 2 to 6)). From the viewpoint of curability, n of the component (B) is preferably 2 to 4. Further, from the viewpoint of balancing physical properties and curing rate of the cured product, n is preferably 3. That is, it is preferred that the component (B) has a mercaptopropyl group. Further, the component (B) may be a mixture of a plurality of thiol compounds having different numbers of mercaptoalkyl groups. From the viewpoint of curability, the component (B) is preferably a thiol compound having 2 to 4 mercaptopropyl groups. Further, from the viewpoint of balancing the physical properties and the curing rate of the cured product, component (B) is most preferably a thiol compound having three mercaptopropyl groups. The component (B) itself has a sufficiently flexible skeleton. Therefore, it is possible to effectively reduce the elastic modulus of the cured product. The elastic modulus of the cured product can be controlled by adding the component (B). Therefore, it is possible to increase adhesive strength (especially, peel strength) after curing. Further, the component (B) does not have an ester skeleton in its molecule. Therefore, it is possible to suppress a decrease in adhesive strength of the cured resin composition after a moisture resistance test by the component (B). Here, all of pentaerythritol tetrakis (3-mercaptopropionate), trimethylolpropane tris(3-mercaptopropionate), dipentaerythritol hexakis (3-mercaptopropionate), and pentaerythritol tetrakis (3-mercaptobutyrate), which are conventionally used as a thiol compound, contain an ester bond. The ester bond tends to be hydrolyzed. Therefore, it is considered that these conventional thiol compounds are inferior in moisture resistance. In contrast, the component (B) has an ether bond instead of containing an ester bond. Therefore, it is considered that the component (B) is more flexible and has high hydrolysis resistance. Further, since the component (B) has lower polarity, its viscosity is also considered to be low. An example of a commercially available product of the component (B) is a thiol compound (product name: PEPT, thiol equivalent weight: 124 g/eq) manufactured by SC Organic Chemical Co., Ltd. As the component (B), a single thiol compound may be used, or two or more thiol compounds may be used in combination.

As described above, the component (B) has a lower viscosity than other thiol compounds from its structure. Imidazole and tertiary amine which can be contained in the component (C) have an amino group. Reaction between the amino group and a thiol group in the resin composition is a starting point, and the polymerization of the component (A) and the component (B) is started. The component (C) as the latent curing accelerator is designed so that the reaction of the amino group hardly occurs at room temperature. However, according to findings obtained by the present inventors, the component (B) is easily penetrated into the component (C) due to its low viscosity. As a result, the component (B) and the component (C) easily react. Therefore, pot life of the resin composition is shortened. Therefore, in the present embodiment, the pot life is improved by using the component (B) and the thiol compound (component (b)) other than the component (B) in combination.

The polyfunctional thiol compound as the component (b) is a thiol compound other than the component (B). Examples of the polyfunctional thiol compound as the component (b) include (b1) a thiol compound having no ester bond and (b2) a thiol compound having an ester bond. From the viewpoint of peel strength (initial and after the moisture resistance test) and improvement of pot life, an amount of the component (B) is preferably 5 to 80 parts by mass based on 100 parts by mass of total amount of the thiol compounds as the component (B) and the component (b). If weight of the component (B) is less than 5 parts by mass, since the elastic modulus of the cured product is high, there is a possibility that a desired peel strength cannot be obtained. If the weight of the component (B) is 80 parts by mass or more, the pot life of the resin composition may be shortened. Further, from the viewpoint of reducing the viscosity, molecular weight of the component (b) is preferably 300 to 1000.

An example of the component (b1) is a thiol-substituted glycoluril derivative. An example of thiol-substituted glycoluril derivative is a nitrogen-containing heterocyclic compound represented by the following general formula (2):

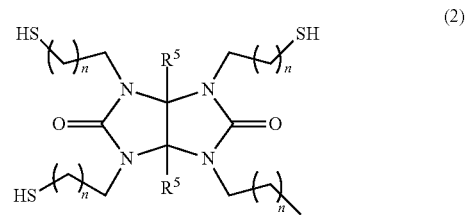

(wherein $R^5$ and $R^6$ are each independently hydrogen, an alkyl group having 1 to 10 carbon atoms, or a phenyl group, and n is an integer of 0 to 10). Further, an example thereof is a polyfunctional nitrogen-containing heterocyclic compound represented by a chemical formula (3) or a chemical formula (4):

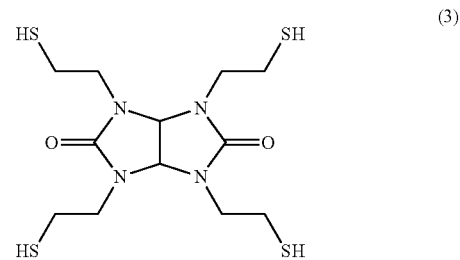

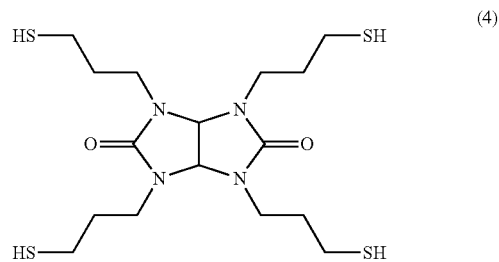

and having a functional group (—CH$_2$—CH$_2$—SH, or —CH$_2$—CH$_2$—CH$_2$—SH) bonded to each of four nitrogen atoms of the nitrogen-containing heterocyclic compound.

Examples of commercially available products of the component (b1) include thiol-substituted glycoluril derivatives (trade name: TS-G (thiol equivalent: 100 g/eq), C3TS-G (thiol equivalent: 114 g/eq)) manufactured by Shikoku Chemicals Corporation. As the component (b1), a single compound may be used, or two or more compounds may be used in combination. When (b1) is used in combination, a weight ratio of the component (B) to the component (b1) is preferably 5:95 to 80:20, more preferably 20:80 to 80:20. It is possible to adjust the elastic modulus after curing while maintaining moisture resistance by using the component (B) and the component (b1) in combination. As a result, the adhesive strength (peel strength) can be improved. Further, it is possible to reduce the amount of the component (B) used in the resin composition by using the component (b1). Therefore, the pot life can be improved.

Examples of the component (b2) include pentaerythritol tetrakis (3-mercaptopropionate), trimethylolpropane tris(3-mercaptopropionate), dipentaerythritol hexakis (3-mercaptopropionate), pentaerythritol tetrakis (3-mercaptobutyrate), tris[(3-mercaptopropionyloxy)-ethyl]isocyanurate, pentaerythritol tetrakis (3-mercaptobutyrate), 1,4-bis(3-mercaptobutyryloxy)butane, 1,3,5-tris(3-mercaptobutyryloxyethyl)-1,3,5-triazine-2,4,6(1H, 3H, 5H)trione, trimethylolpropane tris(3-mercapto butyrate), and trimethylolethane tris(3-mercapto butyrate). The ester bonds of these compounds tend to be hydrolyzed. Therefore, the cured product is inferior in moisture resistance. As a result, the peel strength after the moisture resistance test is reduced. However, it is possible to reduce the amount of the component (B) used in the resin composition by using the component (b2). Thus, the pot life can be improved. Therefore, when the component (b2) is used in combination, from the viewpoint of peel strength and pot life after the moisture resistance test, weight of the component (b2) is such that a weight ratio of the component (B) to the component (b2) is preferably 33:67 to 80:20. When the component (B) and the component (b1) are used in combination, the weight of the component (b2) is preferably 5.3 parts by mass or more and 200 parts by mass or less, more preferably 5.3 parts by mass or more and 100 parts by mass or less, based on 100 parts by mass of the total amount of the components (B) and (b1).

The latent curing accelerator as the component (C) is a compound which is inactive at ambient temperature and is activated by heating to function as the curing accelerator. Examples of the component (C) include an imidazole compound which is solid at room temperature, a solid dispersion type amine adduct-based latent curing accelerator such as a reaction product (amine-epoxy adduct-based) of an amine compound and an epoxy compound, and a reaction product (urea type adduct-based) of an amine compound and an isocyanate compound or a urea compound. The component (C) is combined with the component (B) and the component (b), so that an adhesive can be fast-cured at low temperature.

Examples of imidazole compounds which are solid at ambient temperature include 2-heptadecylimidazole, 2-phenyl-4,5-dihydroxymethylimidazole, 2-undecylimidazole, 2-phenyl-4-methyl-5-hydroxymethylimidazole, 2-phenyl-4-benzyl-5-hydroxymethylimidazole, 2,4-diamino-6-(2-methylimidazolyl-(1))-ethyl-S-triazine, 2,4-diamino-6-(2'-methylimidazolyl-(1)')-ethyl-S-triazine/isocyanuric acid adduct, 2-methylimidazole, 2-phenylimidazole, 2-phenyl-4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)-urea, and N,N'-(2-methylimidazolyl-(1)-ethyl)-adipoyldiamide. However, the imidazole compound is not limited to these compounds.

Examples of the epoxy compound used as one of raw materials for producing the solid dispersion type amine adduct-based latent curing accelerator (amine-epoxy adduct-based) include polyglycidyl ether obtained by reacting polyhydric phenol such as bisphenol A, bisphenol F, catechol or resorcinol with epichlorohydrin, and polyglycidyl ether obtained by a polyhydric alcohol such as glycerin or polyethylene glycol with epichlorohydrin. Further, other examples include glycidyl ether ester obtained by reacting a hydroxycarboxylic acid such as p-hydroxybenzoic acid or β-hydroxynaphthoic acid with epichlorohydrin, polyglycidyl ester obtained by reacting a polycarboxylic acid such as phthalic acid or terephthalic acid with epichlorohydrin, and glycidyl amine compound obtained by reacting an amine compound such as 4,4'-diaminodiphenylmethane or m-aminophenol with epichlorohydrin. Furthermore, other examples include a polyfunctional epoxy compound such as an epoxidized phenol novolac resin, an epoxidized cresol novolac resin, or an epoxidized polyolefin, and a monofunctional epoxy compound such as butyl glycidyl ether, phenyl glycidyl ether or glycidyl methacrylate. However, the epoxy compound is not limited to these compounds.

The amine compound used as another raw material for producing the solid dispersion type amine adduct-based latent curing accelerator may be compound having one or more active hydrogen(s) capable of addition reaction with an epoxy group in the molecule and having at least one functional group selected from a primary amino group, a secondary amino group and a tertiary amino group in the molecule. Examples of such amine compounds are shown below. However, the amine compound is not limited to these compounds. Examples thereof include aliphatic amines such as diethylenetriamine, triethylenetetramine, n-propylamine, 2-hydroxyethylaminopropylamine, cyclohexylamine, and 4,4'-diamino-dicyclohexylmethane, an aromatic amine compound such as 4,4'-diaminodiphenylmethane or 2-methylaniline, and a heterocyclic compound containing a nitrogen atom such as 2-ethyl-4-methylimidazole, 2-ethyl-4-methylimidazoline, 2,4-dimethylimidazoline, piperidine or piperazine. However, the amine compound is not limited to these compounds.

Among them, the compound having a tertiary amino group in the molecule is a raw material which gives a latent curing accelerator having excellent curing promoting ability. Examples of such compounds include amine compounds such as dimethylaminopropylamine, diethylaminopropylamine, di-n-propylaminopropylamine, dibutylaminopropylamine, dimethylaminoethylamine, diethylaminoethylamine, or N-methylpiperazine, primary amines or secondary amines having a tertiary amino group in the molecule, such as imidazole compounds such as 2-methylimidazole, 2-ethylimidazole, 2-ethyl-4-methylimidazole or 2-phenylimidazole. Further, other examples include 2-dimethylaminoethanol, 1-methyl-2-dimethylaminoethanol, 1-phenoxymethyl-2-dimethylaminoethanol, 2-diethylaminoethanol, 1-butoxymethyl-2-dimethylaminoethanol, 1-(2-hydroxy-3-phenoxypropyl)-2-methylimidazole, 1-(2-hydroxy-3-phenoxypropyl)-2-ethyl-4-methylimidazole, 1-(2-hydroxy-3-butoxypropyl)-2-methylimidazole, 1-(2-hydroxy-3-butoxypropyl)-2-ethyl-4-methylimidazole, 1-(2-hydroxy-3-butoxypropyl)-2-phenylimidazoline, 1-(2-hydroxy-3-butoxypropyl)-2-methylimidazoline, 2-(dimethylaminomethyl) phenol, 2,4,6-tris(dimethylaminomethyl) phenol, N-β-hydroxyethyl morpholine, 2-dimethylaminoethanethiol, 2-mercaptopyridine, 2-benzimidazole, 2-mercaptobenzimidazole, 2-mercaptobenzothiazole, 4-mercaptopyridine, N,N-dimethylaminobenzoic acid, N,N-dimethylglycine, nicotinic acid, isonicotinic acid, picolinic acid, N,N-dimethylglycine hydrazide, N,N-dimethylpropionic acid hydrazide, nicotinic acid hydrazide, and alcohols, phenols, thiols, carboxylic acids, hydrazides and the like containing a tertiary amino group in the molecule, such as isonicotinic acid hydrazide. However, compounds having a tertiary amino group in the molecule are not limited to these compounds.

Examples of the isocyanate compound used as still another raw material producing the solid dispersion type amine adduct-based latent curing accelerator include a monofunctional isocyanate compound such as n-butyl isocyanate, isopropyl isocyanate, phenyl isocyanate, or benzyl isocyanate, and a polyfunctional isocyanate compound such as hexamethylene diisocyanate, toluylene diisocyanate, 1,5- naphthalene diisocyanate, diphenylmethane-4,4'-diisocyanate, isophorone diisocyanate, xylylene diisocyanate, paraphenylene diisocyanate, 1,3,6-hexamethylene triisocyanate, or bicycloheptane triisocyanate. Further, terminal isocyanate group-containing compounds and the like obtained by reacting these polyfunctional isocyanate compounds with active hydrogen compounds can also be used. Examples of such a terminal isocyanate group-containing compound include an addition compound having a terminal isocyanate group obtained by reacting toluylene diisocyanate with trimethylolpropane, and an addition compound having a terminal isocyanate group obtained by reacting tolylene diisocyanate with pentaerythritol. However, the terminal isocyanate group-containing compound is not limited to these compounds.

Examples of urea compounds include urea and thiourea. However, the urea compound is not limited to these compounds.

The solid dispersion type latent curing accelerator which can be used in the present embodiment can be easily prepared, for example, as follows. So as to form a combination of two components of the amine compound and the epoxy compound, three components of the two components and the active hydrogen compound, or two or three components of the amine compound and the isocyanate compound and/or the urea compound, collected components are mixed. Then, the components react at a temperature from room temperature to 200° C. Thereafter, cooled and solidified reactant is pulverized. Or, the components react in a solvent such as methyl ethyl ketone, dioxane, or tetrahydrofuran. After removing the solvent, solid content is pulverized.

Examples of amine-epoxy adduct-based (amine adduct-based) product among typical examples of commercially available product of the solid dispersion type latent curing accelerator include "Amicure PN-23" (trade name of Ajinomoto Fine-Techno Co., Inc.), "Amicure PN-40" (trade name of Ajinomoto Fine-Techno Co., Inc.), "Amicure PN-50" (trade name of Ajinomoto Fine-Techno Co., Inc.), "Hardener X-3661S" (trade name of A.C.R. K.K.), "Hardener X-3670S" (trade name of A.C.R. K.K.), "Novacure HX-3742" (trade name of Asahi Kasei Corporation), "Novacure HX-3721" (trade name of Asahi Kasei Corp.), "Novacure HXA9322HP" (trade name of Asahi Kasei Corporation), and "FXR1121" (trade name of T&K TOKA Corporation). Examples of the urea type adduct-based product include "FUJICURE FXE-1000" (trade name of T&K TOKA Corporation), and "FUJICURE FXR-1030" (trade name of T&K TOKA Corporation). However, the above-mentioned commercial products are not limited thereto. As the component (C), a single substance may be used, or two or more substances may be used in combination. From the viewpoints of pot life and curability, the latent curing accelerator as component (C) is preferably the solid dispersion type amine adduct-based latent curing accelerator.

In the resin composition, a ratio of the thiol functional group equivalent to the epoxy functional group equivalent (functional group equivalent ratio), [thiol functional group equivalent]/[epoxy functional group equivalent] is preferably from 0.5 to 2.0. Here, the thiol functional group equivalent means the number of all the thiol groups in the resin composition. And, the epoxy functional group equivalent means the number of all the epoxy groups in the resin composition. The thiol functional group equivalent is a numerical value obtained by dividing a weight of each thiol compound in the resin composition by each thiol equivalent. Here, the thiol equivalent is a numerical value obtained by dividing a molecular weight of the thiol compound by the number of thiol groups in one molecule. An actual thiol equivalent can be determined, for example, by determining thiol number by potentiometric measurement. The epoxy functional group equivalent is a numerical value obtained by dividing a weight of each epoxy resin in the resin composition by each epoxy equivalent. Here, the epoxy equivalent is a numerical value obtained by dividing a molecular weight of the epoxy resin by the number of epoxy groups in one molecule. When the functional group equivalent ratio is set in a range of 0.5 to 2.0, the epoxy group and the thiol group can react with each other by a certain amount or more to form high polymer more reliably. Therefore, it is possible to easily achieve high adhesive strength. When the functional group equivalent ratio is less than 0.5, homopolymerization of the epoxy resin proceeds. Therefore, there is a possibility that the peel strength tends to decrease due to crosslinking density which is too high. When the functional group equivalent ratio is more than 2.0, molecular crosslinking is not sufficiently formed. Therefore, bleeding tends to occur on a surface of the cured product. As a result, there is a possibility that the peel strength tends to decrease.

The content of the component (A) is preferably 10 to 90 parts by mass based on 100 parts by mass of the resin composition, from the viewpoint of the physical properties of the cured product of the resin composition.

The component (C) is preferably 0.1 to 40 parts by mass, more preferably 1 to 40 parts by mass, based on 100 parts by mass of the resin composition, from the viewpoint of the curing rate of the resin composition and the pot life.

The resin composition of the present disclosure preferably includes (D) a silane coupling agent, further from the viewpoint of the adhesive strength after the moisture resistance test after curing of the resin composition. Examples of the component (D) include 3-glycidoxypropyltrimethoxysilane, 3-aminopropyltrimethoxysilane, vinyltrimethoxysilane, 3-triethoxysilyl-N-(1,3-dimethyl-butylidene) propylamine, p-styryltrimethoxysilane, 3-methacryloxypropylmethyltrimethoxysilane, 3-acryloxypropyltrimethoxysilane, 3-ureidopropyltriethoxysilane, 3-mercaptopropyltrimethoxysilane, bis(triethoxysilylpropyl) tetrasulfide, and 3-isocyanatepropyltriethoxysilane. Among these compounds, 3-glycidoxypropyltrimethoxysilane, 3-aminopropyltrimethoxysilane, and 3-triethoxysilyl-N-(1,3-dimethyl-butylidene) propylamine are preferred. Examples of commercially available products include 3-glycidoxypropyltrimethoxysilane (product name: KBM403) manufactured by Shin-Etsu Chemical Co., Ltd., 3-mercaptopropyltrimethoxysilane (product name: KBM803), 3-aminopropyltriethoxysilane (Product name: KBE903), and 3-triethoxysilyl-N-(1,3-dimethyl-butylidene) propylamine (product name: KBE9103) manufactured by Shin-Etsu Chemical Co., Ltd. As the component (D), a single compound may be used, or two or more compounds may be used in combination.

From the viewpoint of the adhesive strength after curing of the resin composition and the adhesive strength after the moisture resistance test, the content of the component (D) is preferably 0.1 to 5 parts by mass based on 100 parts by mass of the resin composition.

Further, if necessary, within a range not to impair the purpose of the present embodiment, the resin composition can be blended with an additive or the like such as carbon black, titanium black, silica filler, alumina filler, talc filler, calcium carbonate filler, polytetrafluoroethylene (PTFE) filler, an ion trapping agent, a leveling agent, an antioxidant, a deformer, or a thixotropic agent. Further, a viscosity modifier, a flame retardant, a solvent, or the like may be blended in the resin composition.

The resin composition can be obtained by stirring, melting, mixing, and dispersing, for example, the components (A), (B), (b), (C) and other additives simultaneously or separately, if necessary, with heat treatment. Devices used for mixing, stirring, dispersing and the like are not particularly limited. A crusher, a Henschel mixer, a three-roll mill, a ball mill, a planetary mixer, a bead mill or the like equipped with a stirrer and a heating device can be used. Further, these devices may be used in combination as appropriate.

The resin composition thus obtained is thermosetting. Especially, the resin composition can be cured at 80° C., preferably for 5 hours, more preferably for 1 hour. Here, curing means that the peel strength of the resin composition after curing is 0.1 N/mm or more. When used in an image sensor module, the thermal curing condition of the resin composition is preferably from 60 to 90° C. for 30 to 120 minutes from the viewpoint of low temperature fast curability.

The resin composition of the present disclosure can be used, for example, as the adhesive, a sealing material, and a dam agent, or raw materials thereof for bonding components to each other. For the adhesive and the sealing material for electronic components, injectability to a narrow portion is required in some cases. The resin composition of the present disclosure can be reduced in viscosity and is therefore suitable for these uses. Further, the resin composition of the present disclosure is excellent in pot life. Note that the dam agent is formed on an outer periphery of a substrate in advance, for example, before sealing a plurality of semiconductor chips or the like with a low viscosity underfill or the like on the substrate. By forming the dam agent, it is possible to prevent outflow of the low viscosity underfill for sealing the plurality of semiconductor chips afterward. Further, the adhesive containing the resin composition of the present disclosure also enables good bonding to engineering plastics, ceramics, and metals.

[Semiconductor Device]

In the semiconductor device of the present disclosure, at least two adherends formed of at least one material selected from the group consisting of engineering plastics, ceramics, and metals are adhered with the above-mentioned cured product of the adhesive.

The adherend is formed of at least one material selected from the group consisting of engineering plastics, ceramics, and metals. Here, engineering plastics (hereinafter referred to as EP) refers to plastics having a tensile strength of 49 MPa or more and a flexural modulus of 2.5 GPa or more even when exposed to an environment of 100° C. for 100 hours. As EP, any of thermoplastic EP and thermosetting EP can be used. Examples of thermoplastic EP include polyacetal, polyamide (PA), polycarbonate (PC), modified polyphenylene ether, polybutylene terephthalate, glass fiber (GF) reinforced polyethylene terephthalate, ultrahigh molecular weight polyethylene, and syndiotactic polystyrene. Examples of thermosetting EP include epoxy, glass epoxy (FR-4), phenol, and silicone.

As EP, super engineering plastics are preferable. Here, super engineering plastics (hereinafter referred to as super EP) refers to EP having a tensile strength of 49 MPa or more and a flexural modulus of 2.5 GPa or more even when exposed to an environment of 150° C. for 100 hours. Examples of super EP include amorphous polyarylate, polysulfone, polyethersulfone, polyphenylene sulfide, polyether ether ketone, polyimide (PI), polyetherimide, polyamideimide (PAI), fluororesin, and liquid crystal polymer (LCP).

From the viewpoints of heat resistance, dimensional stability, and electrical insulation properties, EP is preferably at least one selected from the group consisting of LCP, polycarbonate (PC), polyimide (PI), polyamide (PA), polyamideimide (PAI), and epoxy resin.

Examples of ceramics include alumina ($Al_2O_3$), aluminum nitride (AlN), silicon carbide (SiC), boron nitride (BN), silicon nitride (SiN), and glass. From the viewpoints of thermal conductivity, thermal expansion coefficient, and chemical durability, alumina and silicon nitride are preferable.

Examples of metals include stainless steel, titanium and its alloys, nickel and its alloys, copper and its alloys, tin and its alloys, aluminum and its alloys, solder and the like. From the viewpoint of chemical stability such as oxidation resistance, stainless steel, nickel and its alloys are preferable.

Here, ceramics is suitably used as the substrate of the image sensor module having an imaging device. Further, engineering plastics are suitably used as VCM (Voice Coil Motor) of the image sensor module having an optical component.

The semiconductor device of the present disclosure is configured as described above, and its configuration is very suitably adapted to the image sensor module. FIG. 1 shows an example of a cross-sectional view of the image sensor module. An image sensor module 1 shown in FIG. 1 is irradiated with light directed from top to bottom. The light passes through an optical filter (infrared (IR) filter) 50 from an optical lens 40, reaches an image sensor 30 on a substrate 20, and is converted into an electric signal by the image sensor 30. Here, the optical lens 40 is fixed by a lens barrel 60. The lens barrel 60 fixed to a VCM (Voice Coil Motor) 70 moves up and down by the VCM 70. In this manner, focus adjustment to the image sensor 30 is performed. The adhesive 10 used in the semiconductor device of the present invention can be used for all adhesion "between the substrate 20 and the VCM 70, between the VCM 70 and the lens barrel 60, and between the VCM 70 and the optical filter 50". Examples of materials used for the substrate 20 include "EP such as polyimide and ceramics such as alumina". A material used for the lens barrel 60 is EP such as LCP. A material used for the VCM 70 is EP such as LCP. The adhesive used in the semiconductor device of the present disclosure has particularly excellent "adhesive strength after moisture resistance test". Therefore, the adhesive is suitable for adhering these materials. In the adhesive using a conventional thiol-based curing agent, since the adhesive strength of the adhesive is remarkably reduced after the moisture resistance test, there has been a problem that the adhesive deteriorates after a long-term moisture resistance test.

EXAMPLES

The present embodiment will be explained by examples below. However, the present embodiment is not limited to these examples. In the following examples, parts and percentages are parts by mass and percentages by mass unless otherwise indicated.

With compositions shown in Tables 1 and 2, resin compositions were prepared using the three-roll mill. In Tables 1 and 2, the above-mentioned (b2) is exemplified as the component (B'). Further, the above-mentioned (b1) is exemplified as the components (B") and (B'"). Furthermore, when the (C) contains the epoxy resin, the functional group equivalent ratio was calculated using the epoxy functional group equivalent contained in the obtained (C).

[Viscosity]

Within 1 hour from preparation, the viscosity of the resin composition was measured at 10 rpm and at a preset appropriate measurement range (H, R, or U) using an E type viscometer (model number: TVE-22H, rotor name: 1° 34'× R24) manufactured by Toki Sangyo Co., Ltd. From the viewpoint of injectability, the lower the viscosity, the better. Tables 1 to 2 show measurement results.

[Pot Life]

An initial viscosity (Pa·s) of the prepared resin composition was measured at 10 rpm, 25° C. using the E type viscometer (model number: TVE-22H, rotor name: 1° 34'× R24) manufactured by Toki Sangyo Co., Ltd. Next, in an environment of 25° C. and 50% humidity, a part of the resin composition stored in a sealed container was taken out from the sealed container at intervals of 1 hour. Then, the viscosity of the resin composition taken out was measured. An elapsed time from when the initial viscosity was measured until the viscosity twice the initial viscosity was measured was defined as the pot life (hr). The pot life is preferably 3 hours or more. Tables 1 to 2 show the results.

[Peel Strength]

An area of 20 mm×60 mm on a lower substrate (made of SUS-304, smooth plate: 40 mm×60 mm×0.3 mm) was coated with the resin composition. Thickness of the resin composition on the coated area was adjusted to have a thickness of 50 μm using a spacer. An upper substrate (ribbon made of SUS-304 (thickness: 20 μm, width: 5 mm, length: 50 mm)) was placed on the resin composition while taking care not to catch air bubbles. In this way, five test pieces having an adhesive surface of 5 mm×20 mm were prepared. Next, by holding the prepared test piece at 80° C. for 60 minutes with a blast oven, the resin composition of the test piece was thermally cured. In this way, the test piece for peel strength measurement was obtained.

Thereafter, at room temperature, the upper substrate of the test piece was gripped by a peel tester (load measuring instrument LTS-500N-S100 manufactured by Minebea Co., Ltd., and 90° peeling jig). Thereafter, after one end of the cured product was slightly peeled off, the substrate was peeled from the test piece to a pulling distance of 15 mm at an angle of 90° and a pulling speed of 50 mm/min. At this time, the test piece moved horizontally so as to follow the peeling operation by the same distance as the pulling distance. An average value of measured values when the pulling distance was 5 to 15 mm was defined as an initial peel strength.

Further, the peel strength after the moisture resistance test was also obtained by the following method. The test piece for the peel strength measurement was left for 500 hours in a thermo-hygrostat chamber under conditions of a temperature of 85° C. and a humidity of 85%. It was confirmed that the temperature of the test piece taken out from the thermo-hygrostat chamber became equal to ambient temperature within 1 hour. The peel strength obtained by the same measurement method as above using the test piece was defined as the peel strength after the moisture resistance test. The initial peel strength and the peel strength after the moisture resistance test are preferably 0.1 N/mm or more, more preferably 1 N/mm or more. Tables 1 to 2 show the measurement results (unit is N/mm).

[Initial Injection Rate]

Two sheets of double-sided tape (width (W) 3 mm×length (L) 20 mm) having a thickness (T) of 0.05 mm were respectively adhered in layers to each of both long side ends (22 mm) of one *Haemophilus* cover glass (manufactured by Matsunami Glass Ind., Ltd., width (W): 16 mm×length (L): 22 mm×thickness (T): 0.5 mm) as a spacer over an entire length thereof. Subsequently, another piece of *Haemophilus* cover glass was placed on the above-mentioned *Haemophilus* cover glass so that both long sides of the *Haemophilus* cover glasses faced each other. In this manner, the test piece having openings at both ends thereof and having a space of height (H) of 0.1 mm×width (W) of 10 mm×length (L) of 20 mm was produced. Then, one opening of the test piece was coated with the prepared resin composition. A distance traveled by the resin composition in a space of the test piece in one minute thereafter was defined as the initial injection rate (mm/min).

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Component (A) | Epoxy resin 1[1] | 41.0 | 54.0 | 41.0 | 0 | 0 | 45.0 | 40.8 | 42.0 | 40.8 |
| | Epoxy resin 2[2] | 0 | 0 | 0 | 41.0 | 0 | 0 | 0 | 0 | 0 |
| | Epoxy resin 3[3] | 0 | 0 | 0 | 0 | 53.0 | 0 | 0 | 0 | 0 |
| Component (B) | Thiol compound 1[4] | 31.0 | 31.0 | 31.0 | 31.0 | 21.0 | 2.0 | 30.8 | 2.0 | 30.8 |
| Component (B') | Thiol compound 2[5] | 0 | 0 | 0 | 0 | 0 | 0 | 0 | 0 | 0 |
| Component (B'') | Thiol compound 3[6] | 8.0 | 8.0 | 8.0 | 8.0 | 6.0 | 33.0 | 8.0 | 0 | 0 |
| Component (B''') | Thiol compound 4[7] | 0 | 0 | 0 | 0 | 0 | 0 | 0 | 36.0 | 8.0 |
| Component (C) | Latent curing accelerator 1[8] | 20.0 | 0 | 20.0 | 20.0 | 20.0 | 20.0 | 20.0 | 20.0 | 20.0 |
| | Latent curing accelerator 2[9] | 0 | 7.0 | 0 | 0 | 0 | 0 | 0 | 0 | 0 |
| Component (C') | Curing accelerator[10] | 0 | 0 | 0 | 0 | 0 | 0 | 0 | 0 | 0 |
| Component (D) | Silane coupling agent 1[11] | 0 | 0.5 | 0 | 0.5 | 0.5 | 0.5 | 0.5 | 0.5 | 0.5 |
| | Silane coupling agent 2[12] | 0 | 0 | 0.5 | 0 | 0 | 0 | 0 | 0 | 0 |
| | Total | 100.0 | 100.5 | 100.5 | 100.5 | 100.5 | 100.5 | 100.1 | 100.5 | 100.1 |
| | [(Thiol functional group equivalent)/(Epoxy functional group equivalent)] | 1.0 | 1.0 | 1.0 | 1.0 | 1.1 | 1.0 | 1.0 | 1.0 | 1.0 |
| Evaluation | Initial peel strength (unit: N/mm) | 1.1 | 1.1 | 1.1 | 1.3 | 3.0 | 0.3 | 1.1 | 0.4 | 3.2 |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| Peel strength after moisture resistance test (unit: N/mm) | 8.0 | 10.1 | 10.0 | 11.2 | 12.4 | 10.4 | 10.1 | 11.2 | 12.3 |
| Pot life (unit: hr) | 4 | 4 | 4 | 4 | 7 | >8 | 4 | >8 | 4 |
| Viscosity (unit: mPa·s) | — | — | — | — | — | — | 853 | — | 634 |
| Initial injection rate (unit: mm/min) | — | — | — | — | — | — | 7 | — | 8 |

1) Bisphenol A type/bisphenol F type epoxy resin mixture manufactured by DIC Corporation (product name: EXA835LV, epoxy equivalent: 165 g/eq)
2) Bisphenol F type epoxy resin manufactured by Nippon Steel & Sumikin Chemical Co., Ltd. (product name: YDF8170, epoxy equivalent: 159 g/eq)
3) Special type epoxy resin manufactured by Asahi Kasei Corporation (product name: AER9000, epoxy equivalent: 380 g/Eq)
4) Thiol compound manufactured by SC Organic Chemical Co., Ltd. (product name: PEPT, thiol equivalent: 124 g/eq)
5) Pentaerythritol tetrakis (3-mercaptopropionate) manufactured by SC Organic Chemical Co., Ltd. (product name: PEMP, thiol equivalent: 122.7 g/eq)
6) Glycoluril derivative manufactured by Shikoku Chemicals Corporation (product name: TS-G, thiol equivalent: 100 g/eq)
7) Glycoluril derivative manufactured by Shikoku Chemicals Corporation (product name: C3 TS-G, thiol equivalent: 114 g/eq)
8) Latent curing accelerator manufactured by Asahi Kasei Corporation (product name: Novacure HXA9322HP, (curing accelerator):(epoxy resin (epoxy equivalent: 180 g/eq))=1:2 (mass ratio))
9) Latent curing accelerator manufactured by T&K TOKA Corporation (product name: FXR1121)
10) 2-Ethyl-4-methylimidazole manufactured by Shikoku Chemicals Corporation (product name: 2E4MZ)
11) 3-Glycidoxypropyltrimethoxysilane manufactured by Shin-Etsu Chemical Co., Ltd. (product name: KBM403)
12) 3-Mercaptopropyltrimethoxysilane manufactured by Shin-Etsu Chemical Co., Ltd. (product name: KBM803)

TABLE 2

|  |  | Example 10 | Example 11 | Example 12 | Comparative Example 1 | Comparative Example 2 | Comparative Example 3 | Comparative Example 4 | Comparative Example 5 |
|---|---|---|---|---|---|---|---|---|---|
| Component (A) | Epoxy resin 1[1)] | 40.6 | 40.0 | 40.5 | 40.0 | 39.8 | 45.0 | 42.0 | 54.0 |
|  | Epoxy resin 2[2)] | 0 | 0 | 0 | 0 | 0 | 0 | 0 | 0 |
|  | Epoxy resin 3[3)] | 0 | 0 | 0 | 0 | 0 | 0 | 0 | 0 |
| Component (B) | Thiol compound 1[4)] | 13.4 | 31.0 | 28.5 | 40.0 | 0 | 0 | 0 | 31.0 |
| Component (B') | Thiol compound 2[5)] | 26.0 | 9.0 | 2.0 | 0 | 39.8 | 0 | 0 | 0 |
| Component (B'') | Thiol compound 3[6)] | 0 | 0 | 0 | 0 | 0 | 35.0 | 0 | 8.0 |
| Component (B''') | Thiol compound 4[7)] | 0 | 0 | 0 | 0 | 0 | 0 | 38.0 | 0 |
| Component (C) | Latent curing accelerator 1[8)] | 20.0 | 20.0 | 20.0 | 20.0 | 19.9 | 20.0 | 20.0 | 0 |
|  | Latent curing accelerator 2[9)] | 0 | 0 | 0 | 0 | 0 | 0 | 0 | 0 |
| Component (C') | Curing accelerator[10)] | 0 | 0 | 0 | 0 | 0 | 0 | 0 | 7.0 |
| Component (D) | Silane coupling agent 1[11)] | 0.5 | 0.5 | 0.5 | 0 | 0.5 | 0.5 | 0.5 | 0.5 |
|  | Silane coupling agent 2[12)] | 0 | 0 | 0 | 0 | 0 | 0 | 0 | 0 |
|  | Total | 100.5 | 100.5 | 100.5 | 100.0 | 100.0 | 100.5 | 100.5 | 100.5 |
| [(Thiol functional group equivalent)/(Epoxy functional group equivalent)] | | 1.0 | 1.0 | 1.1 | 1.0 | 1.0 | 1.0 | 1.0 | 1.0 |
| Evaluation | Initial peel strength (unit: N/mm) | 1.9 | 2.1 | 2.4 | 2.0 | 0.1 | 0 | 0 | — |
|  | Peel strength after moisture resistance test (unit: N/mm) | 5.0 | 8.4 | 10.5 | 10.3 | NG | — | — | — |
|  | Pot life (unit: hr) | >8 | 4 | 7 | 1 | >8 | >8 | >8 | 0 |
|  | Viscosity (unit: mPa·s) | — | — | — | — | 986 | — | — | — |
|  | Initial injection rate (unit: mm/min) | — | — | — | — | 6 | — | — | — |

As can be seen from Tables 1 and 2, in all of Examples 1 to 12, the resin composition after being cured at a low temperature fast curing condition of 80° C. for 60 minutes has high initial peel strength, high peel strength after the moisture resistance test, and excellent pot life. It should be noted that the reason why the peel strength after the moisture resistance test is higher than the initial peel strength is considered to be the fact that the elastic modulus of the cured product is reduced due to swelling of the cured product under a moisture resistance test environment. In contrast, the pot life of the resin composition of Comparative Example 1 containing only component (B) as the polyfunctional thiol compound was short. The resin composition of Comparative Example 2 containing only the thiol compound to be hydrolyzed as the polyfunctional thiol compound was liquefied after the moisture resistance test. Therefore, it was determined that the resin composition of Comparative Example 2 is unsuitable for adhesive use. Therefore, in Comparative Example 2, the peel strength measurement was not performed (indicated as NG in Table 2). The initial peel strength of Comparative Examples 3 and 4 containing only the component (b1) having no ester bond as the polyfunctional thiol compound was indicated as 0 because it could not be measured. The moisture resistance tests of Comparative Examples 3 and 4 were not performed. The resin composition of Comparative Example 5 containing a curing catalyst not the latent curing accelerator instead of the component (C) was cured during sample preparation. Therefore, each evaluation of Comparative Example 5 could not be performed.

[Adhesive Strength Test of Different Materials]
<Adhesive Strength>

In the combination shown in Table 3, the substrates made of selected materials (SUS-304 smooth plate, alumina, LCP (liquid crystal polymer), PC (polycarbonate), PI (polyimide), PA (polyamide), FR-4 (glass epoxy), PE (polyethylene) and PP (polypropylene)) were coated with the adhesive of Example 6 or the adhesive of Comparative Example 2 as a lower adherend. Subsequently, an upper adherend (ribbon made of SUS-304 (width 5 mm, thickness 20 μm, length 50 mm)) was placed on the lower adherend. The adhesive of the test piece was thermally cured by holding the test piece thus prepared at 80° C. for 60 minutes. Here, LCP, PC, PI, PA and FR-4 are engineering plastics. Among these, LCP and PI are super engineering plastics.

According to the method described above, the initial peel strength and the peel strength after the moisture resistance test of the prepared test piece were measured. The adhesive of the test piece which had a peel strength of 0.1 N/mm or more was evaluated as "Good". The adhesive of the test piece which had a peel strength of less than 0.1 N/mm was evaluated as "Poor". Further, the adhesive which was determined to be unsuitable for adhesive use because it was liquefied after preparation of the test piece was also evaluated as "Poor". Table 3 shows the results.

TABLE 3

|  |  | Example 6 | Comparative Example 2 |
|---|---|---|---|
| Initial peel strength | SUS | Good | Good |
|  | Alumina | Good | Good |
|  | LCP | Good | Good |
|  | PC | Good | Good |
|  | PI | Good | Good |
|  | PA | Good | Good |
|  | FR-4 | Good | Good |
|  | PE | Poor | Poor |
|  | PP | Poor | Poor |

TABLE 3-continued

|  |  | Example 6 | Comparative Example 2 |
|---|---|---|---|
| Peel strength after moisture resistance test | SUS | Good | Poor |
|  | Alumina | Good | Poor |
|  | LCP | Good | Poor |
|  | PC | Good | Poor |
|  | PI | Good | Poor |
|  | PA | Good | Poor |
|  | FR-4 | Good | Poor |
|  | PE | Poor | Poor |
|  | PP | Poor | Poor |

As can be seen from Table 3, the adhesive of Example 6 was the test piece of SUS, alumina and engineering plastic, and had high peel strength. In contrast, the adhesive of Comparative Example 2 was liquefied after the moisture resistance test in all the test pieces of SUS, alumina, engineering plastic, PE, and PP. Therefore, it was determined that the adhesive of Comparative Example 2 was unsuitable for adhesive use. It should be noted that the adhesive of Example 6 also had low peel strength in the test pieces of PE and PP.

The resin composition of the present disclosure may be the following first to fifth resin compositions.

The first resin composition contains (A) an epoxy resin, (B) a thiol compound represented by the following general formula (1)

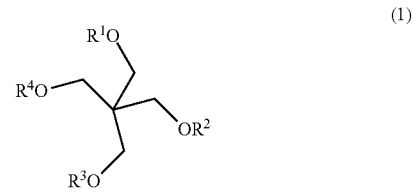

(1)

(wherein $R^1$, $R^2$, $R^3$ and $R^4$ are each independently hydrogen or $C_nH_{2n}SH$ (wherein n is 2 to 6), and at least one of $R^1$, $R^2$, $R^3$ and $R^4$ is $C_nH_{2n}SH$ (wherein n is 2 to 6)), (b) a polyfunctional thiol compound other than the (B), and (C) a latent curing accelerator.

The second resin composition is the first resin composition, wherein the component (b) is a thiol compound having no ester bond.

The third resin composition is the first or second resin composition, wherein the component (b) is a thiol-substituted glycoluril derivative.

The fourth resin composition is any one of the first to third resin compositions, containing 5 to 80 parts by mass of the component (B) based on 100 parts by mass of the total of the thiol compounds of the component (B) and the component (b).

The fifth resin composition is any one of the first to fourth resin compositions, which can be cured at 80° C. for 1 hour.

The adhesive of the present disclosure may contain any one of the first to fifth resin compositions.

The sealing material of the present disclosure may contain any one of the first to fifth resin compositions.

The dam agent of the present disclosure may contain any one of the first to fifth resin compositions.

The semiconductor device of the present disclosure may be any one of the following first to fourth semiconductor devices.

The first semiconductor device includes a cured product of any one of the first to fifth resin compositions, a cured product of the adhesive, a cured product of the sealing material, or a cured product of the dam agent.

The second semiconductor device is the first semiconductor device, wherein at least two adherends formed of at least one material selected from the group consisting of engineering plastics, ceramics, and metals are adhered with the cured product of the adhesive.

The third semiconductor is the second semiconductor device in which the engineering plastic is a super engineering plastic.

The fourth semiconductor device is the second or third semiconductor device, in which the engineering plastic is at least one selected from the group consisting of liquid crystal polymer, polycarbonate, polyimide, polyamide, polyamide-imide, polyetherimide, and epoxy resin.

The image sensor module of the present disclosure may include any one of the first to fourth semiconductor devices.

INDUSTRIAL APPLICABILITY

The resin composition of the present disclosure is fast curable at low temperature, has high adhesive strength (especially, peel strength) after curing, and can suppress a decrease in adhesive strength (especially, peel strength) after the moisture resistance test of the resin composition after curing, and further has excellent pot life. Therefore, the resin composition is very useful particularly as the adhesive agent, the sealing material, and the dam agent.

The invention claimed is:
1. A resin composition comprising:
(A) 10 to 90 parts by mass, based on 100 parts by mass of the resin composition, of an epoxy resin mixture including a bisphenol A type epoxy resin and a bisphenol F type epoxy resin;
(B) a thiol compound represented by the following general formula (1)

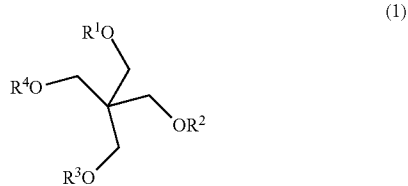

(1)

wherein $R^1$ is hydrogen and $R^2$, $R^3$, and $R^4$ are $C_3H_6SH$;
(b) a polyfunctional thiol compound represented by the following general formula (4)

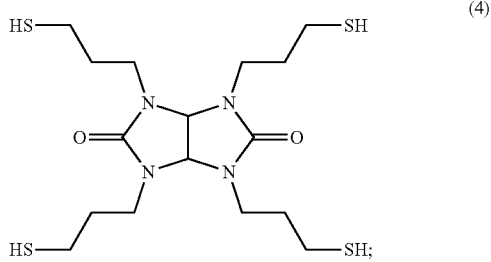

(4)

and
0.1 to 40 parts by mass, based on 100 parts by mass of the resin composition, of (C) a latent curing accelerator including at least either one of an imidazole compound or tertiary amine;
wherein the component (B) and the component (b) are the only thiol compounds present in the resin composition, are present in a (B):(b) weight ratio of from 20:80 to 80:20, and are present in a total amount such that a ratio of the thiol functional group equivalent to the epoxy functional group equivalent is from 0.5 to 2.0.

2. The resin composition according to claim 1, wherein the component (C) includes the imidazole compound.

3. The resin composition according to claim 1, which is curable at 80° C. in 1 hour.

4. An adhesive comprising the resin composition according to claim 1.

5. A semiconductor device comprising a cured product of the adhesive according to claim 4.

6. An image sensor module comprising the semiconductor device according to claim 5.

7. A semiconductor device comprising at least two adherends formed of at least one material selected from the group consisting of engineering plastics, ceramics, and metals, the adherends being bonded with the cured product of the adhesive according to claim 4.

8. The semiconductor device according to claim 7, wherein the engineering plastic is a super engineering plastic.

9. The semiconductor device according to claim 8, wherein the super engineering plastic is at least one selected from the group consisting of amorphous polyarylate, polysulfone, polyethersulfone, polyphenylene sulfide, polyether ether ketone, polyimide, polyetherimide, polyamideimide, fluororesin and liquid crystal polymer.

10. The semiconductor device according to claim 7, wherein the engineering plastic is at least one selected from the group consisting of liquid crystal polymers, polycarbonates, polyimides, polyamides, polyamideimides, polyetherimides, and epoxy resins.

11. A sealing material comprising the resin composition according to claim 1.

12. A semiconductor device comprising a cured product of the sealing material according to claim 11.

13. An image sensor module comprising the semiconductor device according to claim 12.

14. A dam agent comprising the resin composition according to claim 1.

15. A semiconductor device comprising a cured product of the dam agent according to claim 14.

16. An image sensor module comprising the semiconductor device according to claim 15.

17. A semiconductor device comprising a cured product of the resin composition according to claim 1.

18. An image sensor module comprising the semiconductor device according to claim 17.

* * * * *